United States Patent
Thorson

(10) Patent No.: US 11,307,827 B2
(45) Date of Patent: Apr. 19, 2022

(54) TILED SWITCH MATRIX DATA PERMUTATION CIRCUIT

(71) Applicant: Groq, Inc., Mountain View, CA (US)

(72) Inventor: Gregory Michael Thorson, Palo Alto, CA (US)

(73) Assignee: Groq, Inc., Mountain View, CA (US)

( * ) Notice: Subject to any disclaimer, the term of this patent is extended or adjusted under 35 U.S.C. 154(b) by 0 days.

(21) Appl. No.: 16/928,958

(22) Filed: Jul. 14, 2020

(65) Prior Publication Data

US 2020/0348911 A1    Nov. 5, 2020

Related U.S. Application Data

(63) Continuation of application No. 16/117,763, filed on Aug. 30, 2018, now Pat. No. 10,754,621.

(51) Int. Cl.
  *G06F 7/76* (2006.01)
  *G06F 7/78* (2006.01)

(52) U.S. Cl.
  CPC .............. *G06F 7/768* (2013.01); *G06F 7/762* (2013.01); *G06F 7/78* (2013.01)

(58) Field of Classification Search
  CPC .................................................... G06F 7/762
  See application file for complete search history.

(56) References Cited

U.S. PATENT DOCUMENTS

| | | | |
|---|---|---|---|
| 4,670,856 A | 6/1987 | Nishino et al. | |
| 5,541,914 A | 7/1996 | Krishnamoorthy et al. | |
| 6,243,808 B1 | 6/2001 | Wang | |
| 8,089,959 B2 | 1/2012 | Szymanski | |
| 10,754,621 B2* | 8/2020 | Thorson | H03M 13/2778 |
| 2003/0095547 A1 | 5/2003 | Schofield | |
| 2004/0150543 A1 | 8/2004 | Wang et al. | |
| 2009/0138534 A1 | 5/2009 | Lee et al. | |
| 2013/0010636 A1* | 1/2013 | Regula | H04L 49/45 370/254 |

OTHER PUBLICATIONS

Ren et al., "Permutation Capability of Optical Cantor Network", IEEE, pp. 398-403. (Year: 2007).*

(Continued)

*Primary Examiner* — Chuong D Ngo
(74) *Attorney, Agent, or Firm* — Fenwick & West LLP

(57) ABSTRACT

Embodiments of the present disclosure pertain to switch matrix circuit including a data permutation circuit. In one embodiment, the switch matrix comprises a plurality of adjacent switching blocks configured along a first axis, wherein the plurality of adjacent switching blocks each receive data and switch control settings along a second axis. The switch matrix includes a permutation circuit comprising, in each switching block, a plurality of switching stages spanning a plurality of adjacent switching blocks and at least one switching stage that does not span to adjacent switching blocks. The permutation circuit receives data in a first pattern and outputs the data in a second pattern. The data permutation performed by the switching stages is based on the particular switch control settings received in the adjacent switching blocks along the second axis.

18 Claims, 11 Drawing Sheets

(56) References Cited

OTHER PUBLICATIONS

Narksith, P. et al., "Switch adjusting on hierarchical shuffle-exchange networks for all-to-all personalized exchange," The 2013 10th International Joint Conference on Computer Science and Software Engineering, May 29-31, 2013, pp. 121-126.
PCT International Search Report and Written Opinion, PCT Application No. PCT/US2019/048568, dated Nov. 20, 2019, 15 pages.
Waksman, A., "A Permutation Network," Journal of the Association for Computing Machinery, vol. 15, No. 1, Jan. 1968, pp. 159-163.
Yang, X. et al., "Fast subword permutation instructions based on butterfly network," Proceedings of SPIE, Media Processor 2000, Jan. 27-28, 2000, pp. 80-86.
United States Office Action, U.S. Appl. No. 16/117,763, dated Oct. 24, 2019, 11 pages.

* cited by examiner

TILED SWITCH MATRIX DATA PERMUTATION CIRCUIT

CROSS-REFERENCE TO RELATED APPLICATION

This application is a continuation of co-pending U.S. application Ser. No. 16/117,763, filed Aug. 30, 2018, which is incorporated by reference in its entirety.

BACKGROUND

The present disclosure relates to data switching, and in particular, to a tiled switch matrix data permutation circuit.

In many data processing circuits, it is necessary to change the order of various data streams. For example, for data bits representing a matrix of values, it may be desirable to perform a matrix transpose, thereby changing the arrangement of data values in a data stream. Typical systems with limited data pattern permutation needs may use custom circuits to perform a limited number of such permutations. However, in a dynamic system where many such data pattern permutations may be needed, it would be beneficial to have a circuit capable of receiving any pattern of input data and outputting a wide range of different patterns that may be required by the system. One example application where such a feature would be highly advantageous is in an artificial intelligence processor.

SUMMARY

Embodiments of the present disclosure pertain to switch matrix circuit including a data permutation circuit. In one embodiment, the switch matrix comprises a plurality of adjacent switching blocks configured along a first axis, wherein the plurality of adjacent switching blocks each receive data and switch control settings along a second axis. The switch matrix includes a permutation circuit comprising, in each switching block, a plurality of switching stages spanning a plurality of adjacent switching blocks and at least one switching stage that does not span to adjacent switching blocks. The permutation circuit receives data in a first pattern and outputs the data in a second pattern. The data permutation performed by the switching stages is based on the particular switch control settings received in the adjacent switching blocks along the second axis.

The following detailed description and accompanying drawings provide a better understanding of the nature and advantages of the present disclosure.

DETAILED DESCRIPTION

In the following description, for purposes of explanation, numerous examples and specific details are set forth in order to provide a thorough understanding of the present disclosure. Such examples and details are not to be construed as unduly limiting the elements of the claims or the claimed subject matter as a whole. It will be evident to one skilled in the art, based on the language of the different claims, that the claimed subject matter may include some or all of the features in these examples, alone or in combination, and may further include modifications and equivalents of the features and techniques described herein.

Figure 1A:
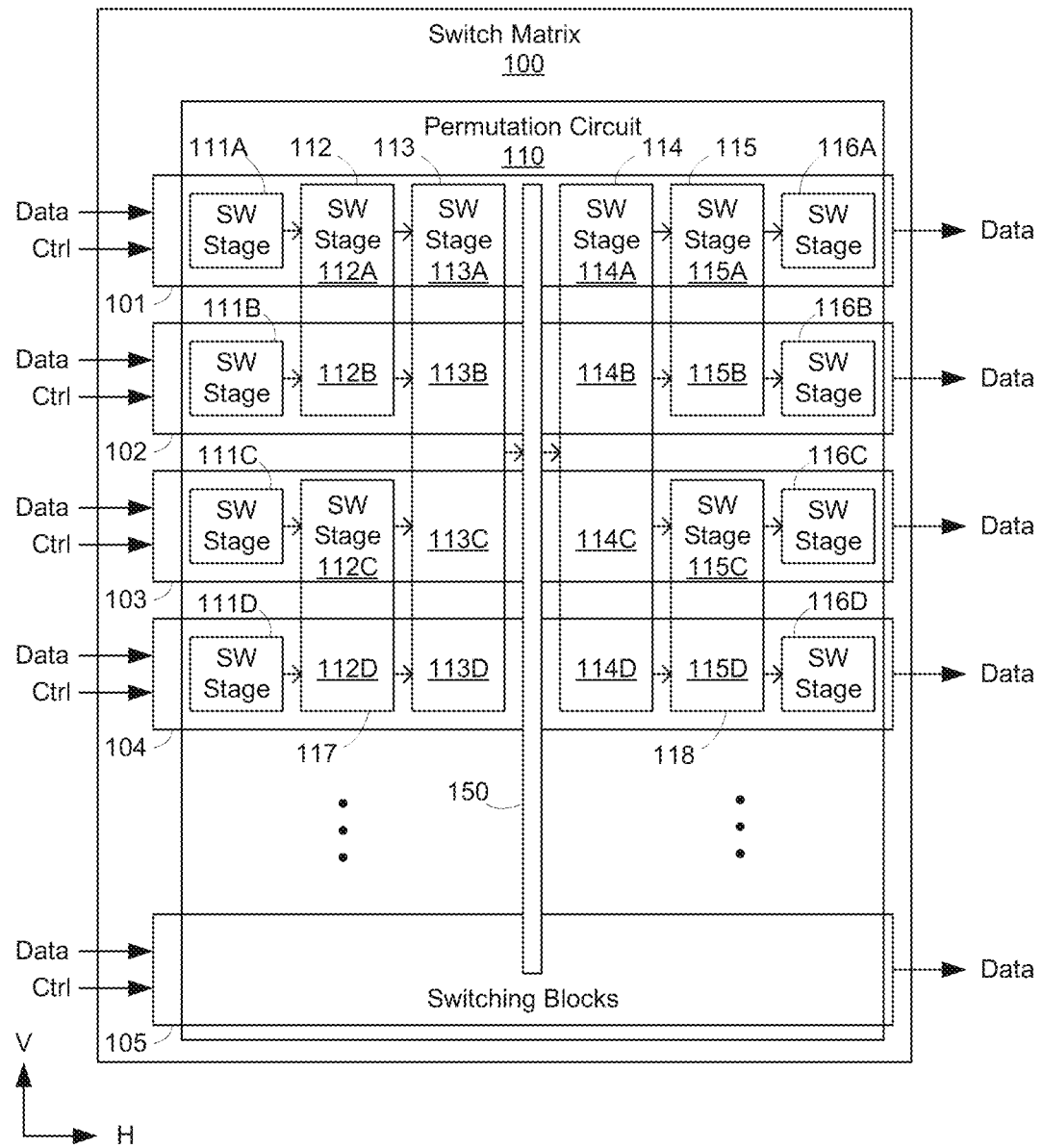
FIG. 1A illustrates a switch matrix including a permutation circuit according to one embodiment.

FIG. 1A illustrates a switch matrix 100 including a permutation circuit 110 according to one embodiment. Features and advantages of the present disclosure include a switch matrix 100 that may receive data having a first pattern and output the data in a wide variety of other patterns based on switch control settings. Referring to FIG. 1A, switch matrix 100 comprises a plurality of adjacent switching blocks ("tiles") 101-105. The switching blocks 101-105 are configured adjacent to each other along a first axis (e.g., along the vertical axis, V, illustrated in FIG. 1A). Input data to be permuted (or re-patterned) and switch control settings ("Ctrl") may be received in switching blocks 101-105 along a second axis (e.g., along the horizontal axis, H, orthogonal to the vertical axis, illustrated in FIG. 1) from other functional blocks of the system, for example. Switching blocks 101-105 may include a wide range of switching circuits for manipulating the flow of data between switch matrix inputs and switch matrix outputs. In some embodiments, the switching blocks 101-105 are substantially the same circuits reproduced and arranged adjacent to each other, for example. Embodiments of the present disclosure include a permutation circuit 110, which may be distributed across switching blocks 101-105, for example, to receive data and output the data in a different pattern. The permutation of the input data may be based on the particular switch control settings received along the second axis, for example. While the focus of the following disclosure is on the permutation circuit, it is to be understood that the switching blocks may have other circuitry for manipulating data, for example.

Permutation circuit 110 comprises a plurality of switching stages spanning a plurality of adjacent blocks and at least one switching stage that does not span to adjacent blocks. Permutation circuit 110 is one example means for permuting data spanning one or more switching blocks. For example, switching block 101 includes switching stage 111A, which receives data and switches the data within block 101. Switching blocks 102-104 similarly include switching stages 111B-D, respectively, that do not span to other switching blocks. Outputs of switching blocks 111A-D are coupled to inputs of successively increasing switching stages, which span to successively more adjacent blocks. For example, outputs of switching stage 111A and 111B are coupled to inputs of switching stage 112, which has components 112A in block 101 and 112B in block 102, for example. Thus, in this example switching stage 112 spans across two blocks 101 and 102. Similarly, outputs of switching stage 111C and 111D are coupled to inputs of a switching stage 117 having components 112C in block 103 and 112D in block 104, for example. Thus, switching stage 112C-D spans across two blocks 103 and 104. In this example, switching stage 113 has inputs coupled to outputs from switching stages 112 and 117. Switching stage 113 has components 113A-D in blocks 101-104, and thus switching stage 113 spans across four blocks 101-104, for example. Switching stages 112 and 113 have successively increasing inputs and outputs, and may therefore be referred to as successively increasing switching stages, for example.

Outputs of switching block 113 are coupled to inputs of successively decreasing switching stages, which span to successively fewer adjacent blocks. For example, switching stage 114 includes components 114A-D in blocks 101-104. Stage 114 has inputs coupled to outputs of stage 113. In one embodiment, an intermediate switching stage 150 may be configured between the successively increasing stages and the successively decreasing stages (e.g., between stages 113 and 114) to provide an additional layer of switching as described in more detail below. Outputs of stage 114 are coupled to inputs of stage 115, which has components 115A-B in blocks 101 and 102. Similarly, outputs of stage 114 are coupled to inputs of stage 118, which has components 115C-D in blocks 103 and 104. In this example, each switching block 101-104 includes an additional switching stage (e.g., stages 116A-D) that does not span to other switching blocks. Accordingly, stages 116A-B have inputs coupled to outputs of stages 115A-B and stages 116C-D have inputs coupled to outputs of stages 115C-D. Stages 116A-D comprise the final switching stage in this example, and produce output data having a different pattern than the input data, where the output pattern is based on the switch control settings (Ctrl) received by the different switching blocks 101-104 used to configure the permutation circuit 110. As illustrated in FIG. 1A, switch matrix 100 may include additional switching blocks as part of a permutation circuit, for example. Additionally, various embodiments may use different numbers of switching stages in series.

Figure 1B:
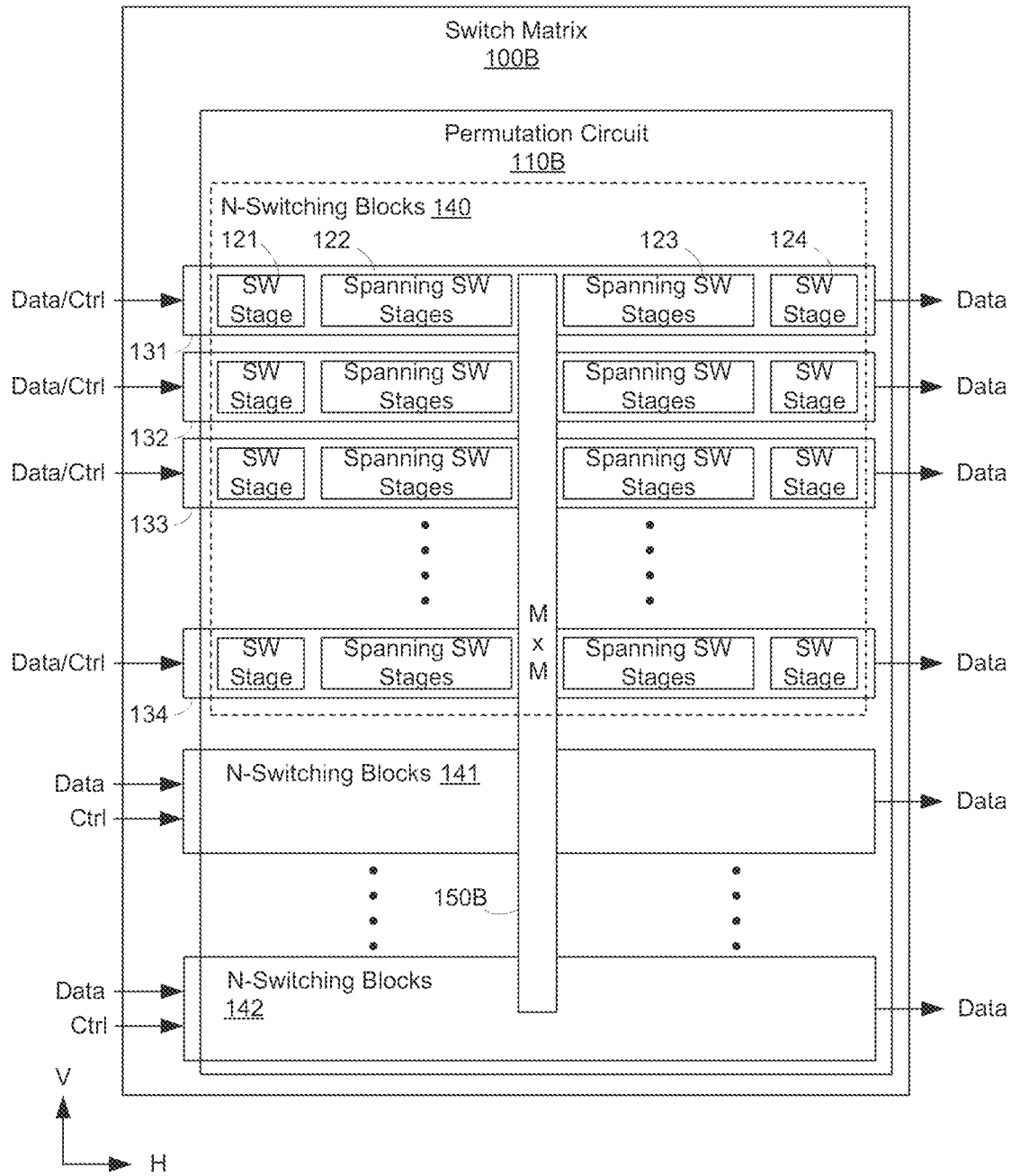
FIG. 1B illustrates a switch matrix including a permutation circuit according to another embodiment.

FIG. 1B illustrates a switch matrix 100B including a permutation circuit 110B according to another embodiment. In this example, pluralities of switching blocks 131-134 are configured in groups 140-142 and coupled together using intermediate switching stage 150B. Intermediate stage 150B may be configured between two spanning switching stages in each switching block (e.g., switching stages 122 and 123). In this example, one intermediate switching stage 150B is configured between successively increasing stages 122 and successively decreasing stages 123 in each switching block. In one example embodiment, a permutation circuit may include M groups of N switching blocks, where M and N are integers, for example. In one example embodiment below, 320 bytes of data may be processed by 5 groups (M=5) of 4 switching blocks (N=4) that each process 16 bytes. In that case, 5 groups of 4 switching blocks all include 5×5 intermediate switching stages configured in parallel to selectively couple 64 bytes of outputs from each group to 64 byte inputs of each of the groups, for example. While the stage spanning multiple switching groups is illustrated in this example and others below as configured between increasing and decreasing stages, it is to be understood that one or more stages spanning multiple switching groups may be configured in other locations.

A switching matrix as illustrated in FIGS. 1A and 1B may be used to permute data received on the input in one pattern to different patterns on the output. In one embodiment, the plurality of adjacent switching blocks each receive data values having a predetermined number of bits (e.g., 1 byte data values). Accordingly, the permutation circuit receives the data values in a first pattern and outputs the data values in a second pattern. For example, it may be desirable to move a data value from one position in an array, matrix, or other data pattern to another position in the array, matrix or data pattern. Features and advantages of the present disclosure allow data values to be moved to new positions within a pattern, for example.

Figure 2:
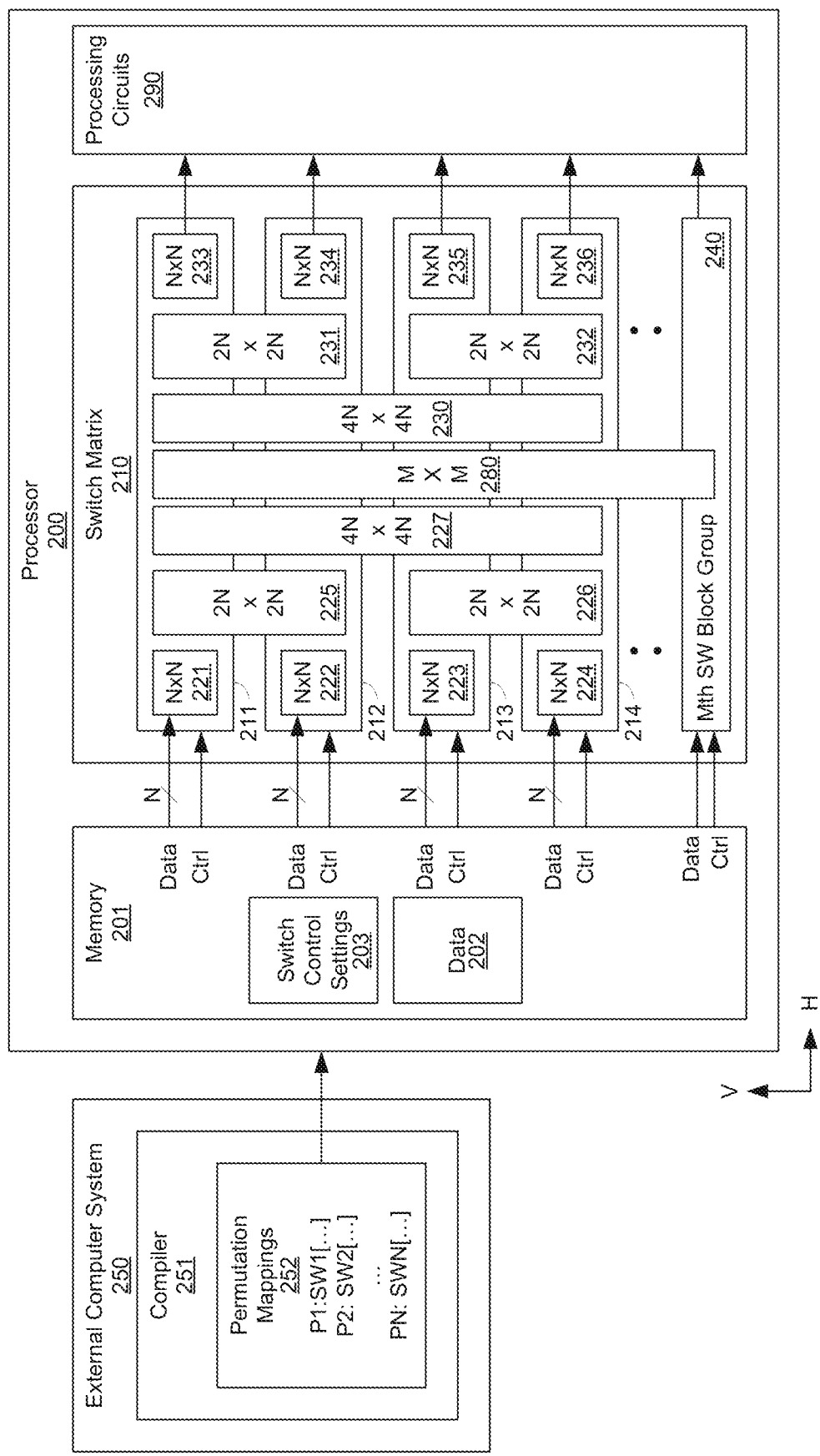
FIG. 2 illustrates an example switch matrix and permutation circuit in a processor according to one embodiment.

FIG. 2 illustrates an example switch matrix and permutation circuit in a processor according to one embodiment. In this example, a switch matrix 210 is included in a data processor 200. Data processor 200 may include memory 201, switch matrix 210, and a variety of other processing circuits 290. Features and advantages of the present disclosure include storing switch control settings 203 in memory 201 for permuting data 202, which in this example may also be stored in memory 201. The stored switch control settings 203 may be received in switch matrix 210 from memory 201. For example, switch control settings 203 may be transferred directly from memory 201 to switching blocks 211-214 to control switch configurations in switching stages 221-227, 230-236, and 280 to produce a predetermined permutation (or transformation) of the input data. Switch control settings may further be received by other groups of switching blocks 240 to control similar switch configurations. For instance, a first set of pre-stored switch control settings may configure the permutation circuit to perform a first permutation on the data, for example, and a second set of pre-stored switch control settings may configure the permutation circuit to perform a second permutation on the data that is different than the first permutation, for example. Advantageously, in this example, no control logic may be required to generate the switch control settings. As described in more detail below, another advantage of various embodiments is that switch control settings may be transferred to the various switching blocks 211-214 along a single axis (e.g., the horizontal axis). Accordingly, communication lines between blocks running along the other axis (e.g., the vertical axis) may be reserved for data, thereby improving the efficiency of the processor, for example. For instance, sending control signals along one axis, while data flows across two axes, reduces the information flowing along one of the axes, which may dramatically improve the bandwidth of the system for moving data, for example. In some embodiments, features and advantages of the present disclosure may include sending new data permutation switch control settings on each clock cycle to perform different data permutations on the same or different data sets received in the data permutation circuit on each clock cycle, for example.

In this example, N data lines are received by each of the input switching stages 221-224 in switching stages 211-214. Here, switching stages 221-224 are N×N, switching stages 225-226 are 2N×2N, and switching stage 227 is 4N×4N. Switching stage 230 may be 4N×4N, switching stages 231-232 may be 2N×2N, and switching stages 233-236 may be N×N such that each switching block 211-214 outputs N data lanes of data permuted based on the stored switch control settings 203, for example. In one embodiment described in more detail below, each switching block processes N=16 B (16 bytes) of data. In this example, M groups of switching blocks 211-214 may be included in a permutation circuit. A plurality of M×M switching stages (e.g., 5×5) may be configured between 4N×4N switching stage 227 and 4N×4N switching stage 230 in each group, for example, to selectively couple outputs of the 4N×4N stages in each group to 4N×4N inputs in the same or other groups, for example.

FIG. 2 further illustrates another aspect of the present disclosure. In this example, data permutations 251 may be specified externally in software and mapped to switch control settings. For example, an external computer system 250 may include a compiler or other software mechanism 251 for generating executable operations. Different permutations P1, P2, . . . , PN may be mapped to different switch control settings SW1-N (e.g., SW1[switch control settings], SW2 [switch control settings], . . . , SWN[switch control settings]). Operations produced by the compiler 252, such as data operations, may be associated with particular permutations and switch control settings. For instance, different data permutations may be specified on corresponding data sets. Accordingly, when an operation is invoked on a particular data set, a corresponding set of stored switch control settings in memory 201 may be sent to switching blocks in switch matrix 210 to perform the specified data permutation on the specified data, for example.

In the following portions of the disclosure, switching stages of 16×16, 32×32, 64×64 and 5×5 are shown for illustrative purposes. It is to be understood that these specific values are not to limit the claims or the teachings of the present disclosure, and that one of ordinary skill in the art would understand that other implementations and embodiments are within the scope of this disclosure. The following examples are therefore merely illustrative.

Figure 3:
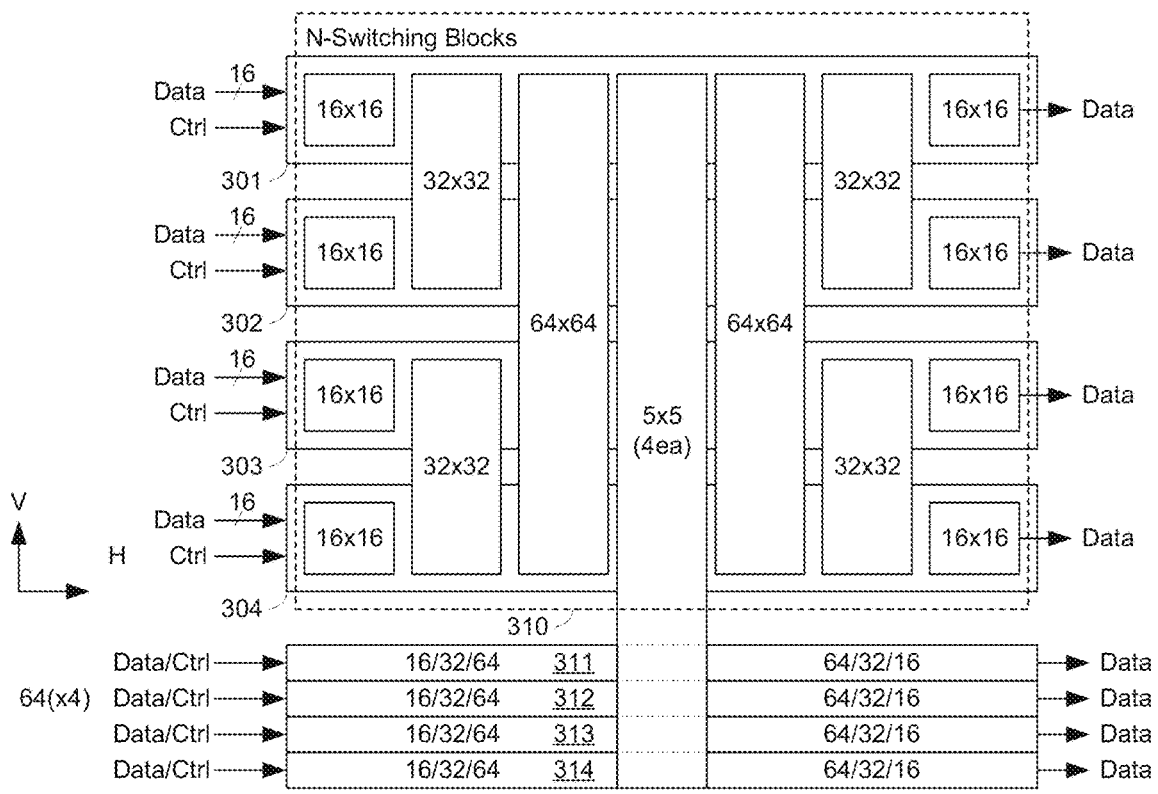
FIG. 3 illustrates an example distributed permutation circuit according to one embodiment.

FIG. 3 illustrates an example distributed permutation circuit according to one embodiment. In this example, four 16 B data lines are received in four switching blocks 301-304 that each include a 16×16 switching stage on the inputs and outputs. Switching blocks 301-304 form one group of a total of 5 groups 310-314. Thus, the permutation circuit in this example may switch data bytes received on any of 320 inputs to any of the 320 outputs. In each switching stage, outputs of the 16×16 switching stages are coupled to inputs of 32×32 switching stages that span two adjacent blocks each. Outputs of the 32×32 switching stages are coupled to inputs of a 64×64 switching stage spanning four blocks 301-304. An intermediate stage of 5×5 switches is coupled to the outputs of the 64×64 stage to selectively couple 64×64 stages of different groups together. In one embodiment, each switching block 301-304 includes the same number of 5×5 intermediate switching stages (e.g., 4 in each switching block) so that the total number of 5×5 inputs and outputs (e.g., 5 inputs & outputs/switch×4 switches/block×4 blocks/group×5 groups=400 inputs and outputs) exceeds the total number of data lines of the permutation circuit (e.g., 16 inputs/block×4 blocks/group×5 groups=320 inputs and outputs), and thus some of the 5×5 switches in some of the blocks may be unused in this example. The 5×5 intermediate switching stage outputs are coupled to inputs of 64×64 stages in the different groups. The outputs of the 64×64 switching stage in each group are coupled to inputs of two 32×32 stages, for example, spanning blocks 301/302 and 303/304 as illustrated in group 310. The two 32×32 stage outputs are coupled to inputs of 16×16 stages on each block 301-304 to produce permuted data outputs across all blocks and all groups of the permutation circuit.

Figure 4:
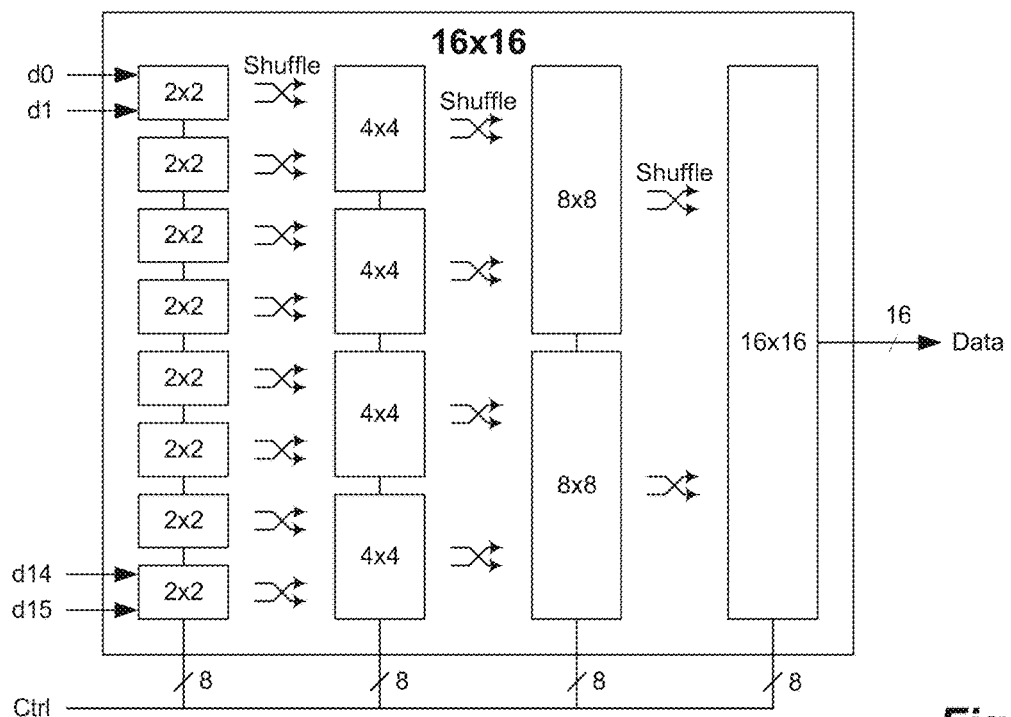
FIG. 4 illustrates an example N×N switching stage according to one embodiment.

FIG. 4 illustrates an example N×N switching stage according to one embodiment. This example illustrates a 16×16 switching stage comprising a plurality of successively increasing switching stages configured in series. In this example, inputs are received on parallel configured 2×2 switching stages, followed by parallel configured 4×4 switching stages, parallel configured 8×8 switching stages, and a 16×16 switching stage providing the 16 B outputs. More specifically, 16 bytes of data (d0-d15) are received by eight (8) 2×2 switching circuits, which are configured in parallel to receive two different bytes of data each. Outputs of the 2×2 switching circuits are coupled to inputs of a plurality of 4×4 switching circuits configured in parallel. In this example, the outputs of the different 2×2 switching circuits are shuffled and then coupled to the 4×4 switching circuits. Similarly, outputs of the 4×4 switching circuits are shuffled and coupled to inputs of two 8×8 switching circuits configured in parallel. Finally, outputs of the 8×8 switching circuits are shuffled and coupled to a 16×16 switching circuit. 16×16 switching circuit produces the 16 byte output. An N×N switching stage as illustrated above may be the first non-spanning stage in a switching block described above. Additionally, an N×N stage as illustrated above may be run in reverse as a non-spanning 16 B output stage in each switching block to produce a permuted output, for example.

FIG. 4 further illustrates switch controls for the switching circuits. One 2×2 switching circuit may receive 1 control bit. Thus, the 2×2 switching circuits together receive 8 control bits. Similarly, the 4×4 switching circuits receive 8 control bits, the 8×8 switching circuits receive 8 control bits, and the 16×16 switching circuit receive 8 control bits. The logic values of the control bits may comprise some of the switch control settings mentioned above, for example.

Figure 5:
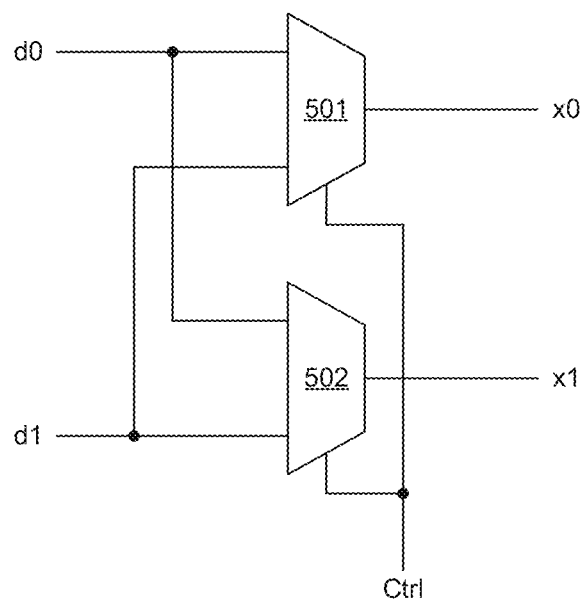
FIG. 5 illustrates an example 2×2 switch used in various embodiments.

FIG. 5 illustrates an example 2×2 switching circuit used in various embodiments. In this example, a 2×2 switching circuit is implemented using two mutliplexers 501 and 502. Each multiplexer receives two inputs, d0 and d1. The value of a control bit ("Ctrl") determines which input is coupled to the two outputs, x0 and x1. In a first state, d0 is coupled to x0 and d1 is coupled to x1, and in a second state, d0 is coupled to x1 and d1 is coupled to x0, for example.

Figure 6:
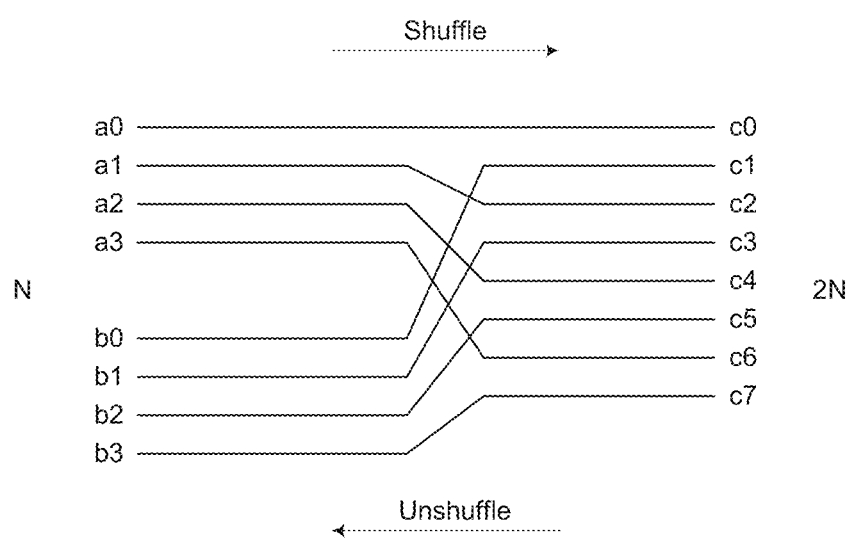
FIG. 6 illustrates shuffling and unshuffling according to various embodiments.

FIG. 6 illustrates shuffling and unshuffling according to various embodiments. Various embodiments may shuffle and unshuffled data between switching stages. FIG. 6 illustrates shuffling and unshuffling for two groups of four lines, a0-3 and b0-3. Shuffling involves inserting a line from one group between each line of the other group as shown in FIG. 6. Unshuffling involves splitting adjacent lines into different groups as shown in FIG. 6. As illustrated below, embodiments of the present disclosure may shuffle or unshuffled switching stages spanning multiple blocks using a bus spanning between the switching blocks, for example.

Figure 7:
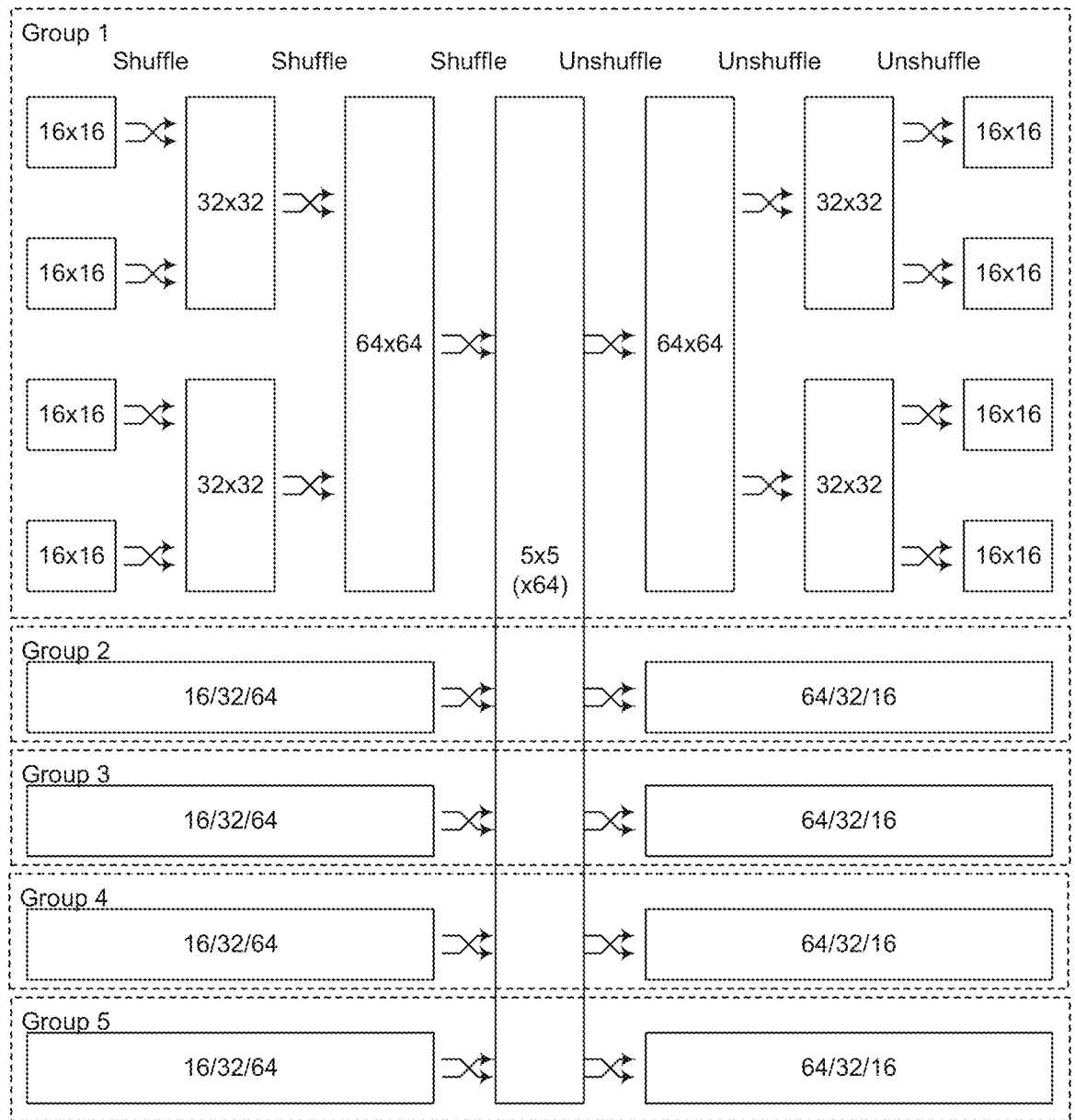
FIG. 7 illustrates a configuration of switching stages in a permutation circuit according to one embodiment.

FIG. 7 illustrates a configuration of switching stages in a permutation circuit according to one embodiment. In this example, series coupled switching stages are shuffled as the switching stages increase to the intermediate switching stage, and series coupled switching stages are unshuffled as the switching stages decrease to the output of the permutation circuit. More specifically, outputs of the 16×16 stage at the input of the permutation circuit are shuffled and then coupled to inputs of the 32×32 stages, the 32×32 stage outputs are shuffled and then coupled to the inputs of the 64×64 stage, and the 64×64 stage outputs in each of the 5 groups are shuffled and then coupled to the inputs of 64 5×5 stages. Conversely, the 5×5 intermediate stage outputs are unshuffled and then coupled to inputs of the 64×64 stages across all 5 groups, the 64×64 stage outputs are unshuffled and then coupled to the inputs of the 32×32 stages, and the 32×32 stage outputs are unshuffled and then coupled to the inputs of the 16×16 stages in each switching block across all 5 groups at the output of the permutation circuit.

Figure 8A:
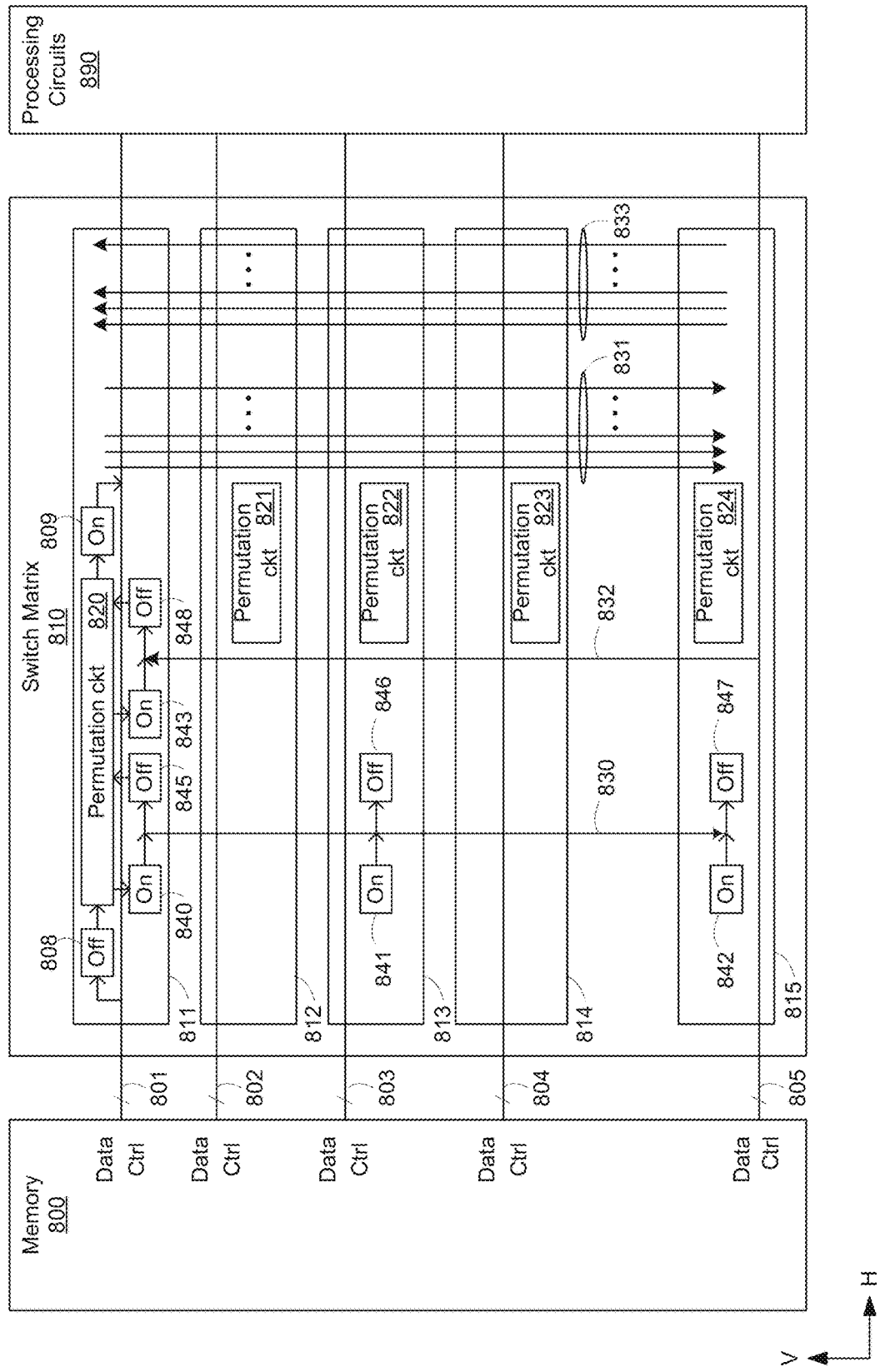
FIG. 8A illustrates data transfer along two axes in a distributed permutation circuit according to one embodiment.

FIG. 8A illustrates data transfer along two axes in a distributed permutation circuit according to one embodiment. Features and advantages of some embodiments of the present disclosure include a permutation circuit distributed across multiple tiles (or switching blocks) that receives switch control settings and input data on one data bus configured along one axis (e.g., here, the horizontal axis) and intermediate data in the switching stages of the permutation circuit are communicated between tiles over another data bus configured along another axis (e.g., here, the vertical axis). For example, as illustrated in FIG. 8A, data and switch control settings, for example, may be transmitted from memory 800 to switching blocks 811-815 over a horizontal bus comprising lines 801-805. As illustrated for switching block 811, the input data and switch control settings may be retrieved from each line 801-805 using a bus receiver circuit ("Off") 808 and input to permutation circuitry components 820-824 in each switching block (e.g., 16×16 stages at the beginning of the permutation circuit in each block 811-814), for example. Outputs of the permutation circuitry 820-824 (e.g., 16×16 stages at the end of the permutation circuit in each block 811-814) are coupled back onto a horizontal bus using a bus transmitter circuit ("On") as illustrated at 809 in switching block 811, for example.

In this example, another bus is configured along a second axis (e.g., here, the vertical axis) and comprises lines 830-833. The vertical bus may include lines 830-831 used for data flowing in one direction (e.g., "southbound" in the direction from the top to the bottom of the layout in FIG. 8A) and other lines 832-833 used for data flowing in the opposite direction (e.g., "northbound" in the direction from the bottom to the top of the layout in FIG. 8A), for example. Switching stages in the permutation circuitry spanning multiple adjacent blocks may send and receive data between adjacent switching blocks over either or both of the northbound and/or southbound bus lines 830-833, for example. For instance, if permutation circuitry 820-823 in switching blocks 811-814 form one switching group as described above, then permutation circuitry 820-823 may couple data to other permutation circuitry (e.g., between 32 and 64 stages) in other switching blocks using a bus transmitter circuits ("On") 840 for the southbound bus or 843 for the northbound bus, for example, as illustrated for permutation circuitry 820. Similarly, permutation circuitry stages in one switching block may receive data from permutation circuitry in other switching blocks using bus receiver circuits ("Off") 845 for the southbound bus or 848 for the northbound bus, for example. Each switching block 811-815 may include circuits for putting data on ("On") or taking data off ("Off") each southbound bus line 830-831 and each northbound bus line 832-833. Accordingly, permutation circuitry in each switching block 811-814 may use the bus lines 830-833 to move data between different switching stages (e.g., 16×16, 32×32, 64×64, 5×5, etc . . . ) in different blocks to perform the data permutations as described herein.

Figure 8B:
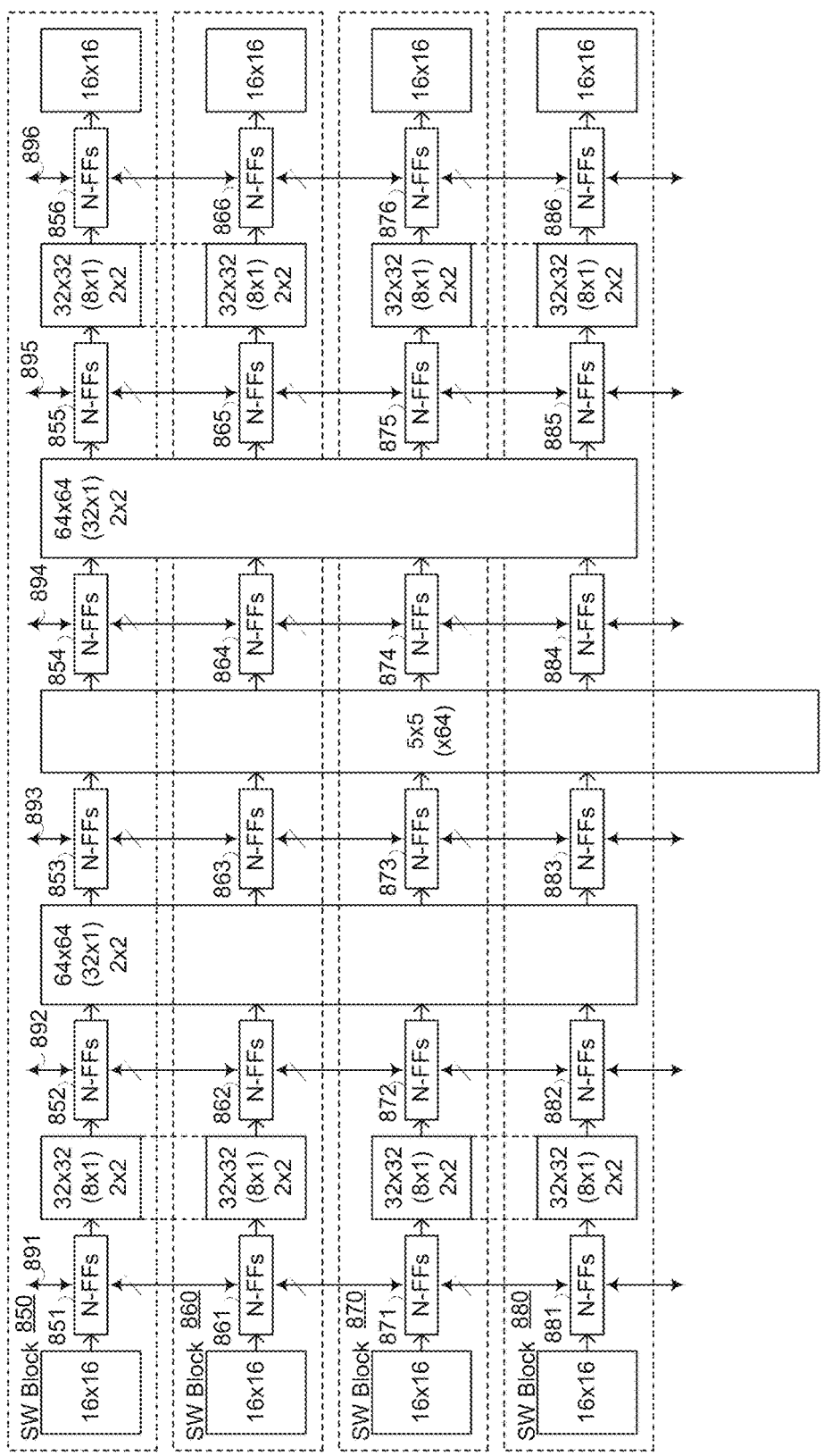
FIG. 8B illustrates using a bus for shuffling and unshuffling in a distributed permutation circuit according to one embodiment.

FIG. 8B illustrates using a bus for shuffling and unshuffling in a distributed permutation circuit according to one embodiment. In this example, shuffling and unshuffling of data between switching stages that span multiple switching blocks is implemented using a data bus running across the adjacently configured switching blocks. For example, shuffling outputs of a 16×16 stage at the input of each switching block 850, 860, 870, and 880 to inputs of a 32×32 switching stage spanning multiple switching blocks may require moving data between adjacent switching blocks. In particular, half of the outputs of the 16×16 switching stage in block 850 that need to be coupled to the inputs of the 32×32 in block 860 may be coupled to flip flops 851 and transferred to block 860 over bus 891. The other half of the outputs of the 16×16 switching stage in block 850 may be coupled to inputs of the 32×32 that reside in block 850, for example. Thus, in this example, 8 bytes of southbound bus lines of bus 891 may be used. Similarly, half of the outputs of the 16×16 switching stage in block 860 that need to be coupled to the inputs of the 32×32 in block 850 may be coupled to flip flops 861 and transferred to block 850 over bus 891. The other half of the outputs of the 16×16 switching stage in block 860 may be coupled to inputs of the 32×32 that reside in block 860, for example. Accordingly, 8 bytes of northbound bus lines of bus 891 may be used. Similarly, bus 891 may be used to shuffle outputs of 16×16 switching stages in blocks 870 and 880 with 32×32 spanning blocks 870 and 880. In one embodiment, different sections of the bus between switching blocks may be isolated (e.g., by a multiplexer), and the same bus lines may be simultaneously used to move data vertically between blocks 870 and 880 that are used to move data vertically between blocks 850 and 860, for example. Accordingly, shuffling data between adjacent switching blocks is carried out using vertical bus 891.

Likewise, 32×32 switching stages in switching blocks 850/860 and 870/880 shuffle outputs to inputs of a 64×64 stage spanning blocks 850, 860, 870, and 880 using bus 892 and flip flops 852, 862, 872, and 882, for example. The 64×64 switching stage in this example may be implemented using 32 2×2 switches, for example. 64×64 switching stages in switching blocks 850, 860, 870, and 880 shuffle outputs to inputs of 64 5×5 switching stages spanning blocks 850, 860, 870, and 880 (and other switching block groups) using bus 893 and flip flops 853, 863, 873, and 883 (and similar components in other block groups—not shown).

On the successively decreasing side of the intermediate switching stage, outputs of the 64 5×5 switching stages spanning blocks 850, 860, 870, and 880 (and other switching block groups) unshuffle to inputs of the 64×64 switching stage spanning switching blocks 850, 860, 870, and 880 using bus 894 and flip flops 854, 864, 874, and 884. Similarly, the 64×64 switching stage in switching blocks 850, 860, 870, and 880 unshuffle outputs to inputs of two 32×32 stages spanning blocks 850/860 and 870/880 using bus 895 and flip flops 855, 865, 875, and 885, for example. Finally, the 32×32 switching stage in switching blocks 850/860 and 870/880 unshuffle outputs to inputs of four 16×16 stages in blocks 850, 860, 870, and 880 using bus 896 and flip flops 856, 866, 876, and 886, for example. Buses 891-896 may form a single multi-wire bus along an axis of the switch matrix, for example, and such a multi-wire bus may be the means for moving data between outputs of one or more switching stages in one switching block to one or more switching stages in other switching blocks, for example. In the example shown in FIG. 8B, flip flops circuits are shown illustratively for moving data between switching blocks on buses 891-896. It is to be understood that a variety of actual circuit connections could be used to implement the above described techniques.

Figure 8C:
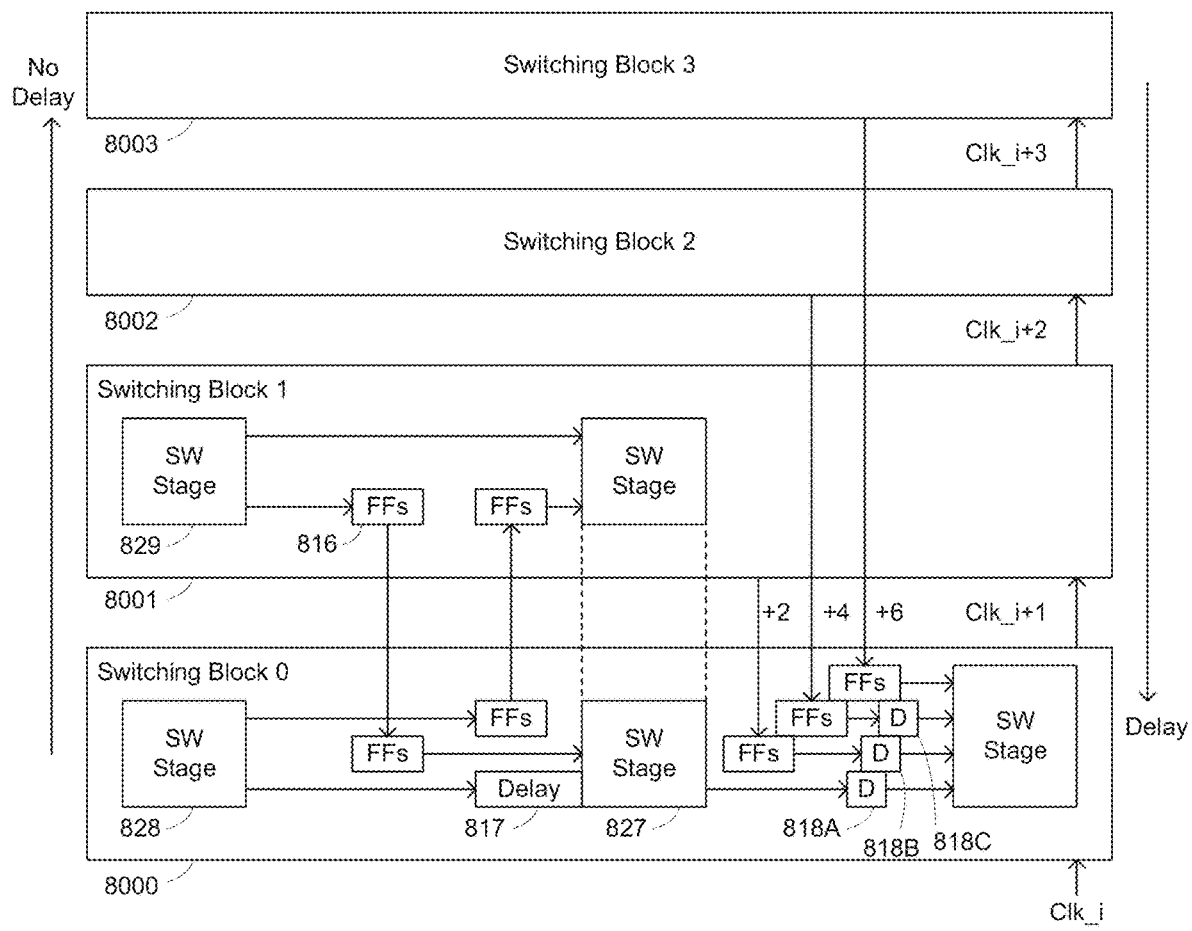
FIG. 8C illustrates synchronizing switching blocks according to one embodiment.

FIG. 8C illustrates synchronizing switching blocks according to one embodiment. In this example, a clock is coupled between adjacent switching blocks and adjacent switching blocks operate on different cycles of the clock. For example, switching block 0 8000 may receive a clock on cycle "i" ("Clk_i"), and the clock is coupled to switching block 1 8001 on the next cycle ("i+1"). Accordingly, switching block 1 8001 receives the clock on the "i+1" cycle. Similarly, the clock is coupled between switching block 1 8001 and switching block 2 8002 on the next cycle ("i+2"). Thus, switching block 2 8002 receives the clock on the "i+2" cycle. Finally, in this illustrative example, the clock is coupled between switching block 2 8002 and switching block 3 8003 on the next cycle ("i+3"). Thus, switching block 3 8003 receives the clock on the "i+3" cycle.

In some embodiments, data moving between switching stages may be delayed along certain data flow paths to time align data received across switching blocks operating on different clock cycles. For instance, data at an output of switching stage 828 in block 0 may be produced one cycle ahead of data at an output of switching stage 829 in block 1 because block 1 is operating one cycle behind block 0, for example. Accordingly, if data from switching stages in different switching blocks is combined in a single switching block, the data may need to be time aligned into the same clock cycle. In this example, data moving in the same direction as the clock distribution between blocks (e.g., vertically up in FIG. 8C) is ahead, in time, of data produced in the other blocks. Accordingly, no time alignment may be required (e.g., the time to travel upward between adjacent blocks may be equal to the time delay between adjacent blocks). However, for data moving in the opposite direction of clock distribution between blocks (e.g., vertically down), there may be double the delay between each adjacent block (e.g., +2 cycles per block; 1 cycle delay in producing a result and 1 cycle delay moving the result down to the next adjacent block).

In one embodiment, delay circuits may be used to time align data between switching blocks. For example, data from an output of switching stage 829 in switching block 1 may be coupled to a switching stage 827 in switching block 0 and combined with data from an output of switching stage 828 in block 0. However, data at the output of stage 829 may be produced 1 clock cycle behind data at the output of stage 828. Additionally, it may take another clock cycle for data from stage 829 to arrive in block 0 over the southbound bus. Thus, data from stage 829 is 2 cycles behind the data from stage 828. Embodiments of the present disclosure include delay circuits configured in data flow paths of a plurality of switching stages to time align data received across switching blocks. In this example, a delay circuit 817 is configured in the data flow path couple to the output of switching stage 828 to time align data from stage 828 with data from switching block 1. Delay 817 may have a two (2) cycle delay, for example, to time align data in blocks 0 and 1. In this example, delay 817 is placed at the input of switching stage 827. However, it is to be understood that delay circuits may be place in other locations along the data path (e.g., at the output of a switching stage, such as stage 828). Similar example delay circuits 818A-C are used to delay data in block 0 that is combined with data from blocks 1, 2, and 3 (e.g., in a 64×64 switching stage). However, additional delays are required because blocks 2 and 3 are clocked by successively delayed clock cycles. For data in block 0 being combined with block 2, a four (4) cycle delay is required, and for data in block 0 being combined with block 3, a six (6) cycle delay is required (e.g., one delay for each clock cycle delay between blocks and one delay for each data transfer between blocks). In this example, data from switching stage 827 in block 0 may be delayed by 6 cycles in delay circuit 818A to be combined with data from block 3, data from block 1 is delayed 4 cycles in delay circuit 818B to be combined with data from block 3, and data from block 2 is delayed 2 cycles in delay circuit 818C to be combined with data from block 3. Similarly, delay circuits may be positioned across multiple data flow paths in a permutation circuit to time align data in various embodiments described above.

Figure 9:
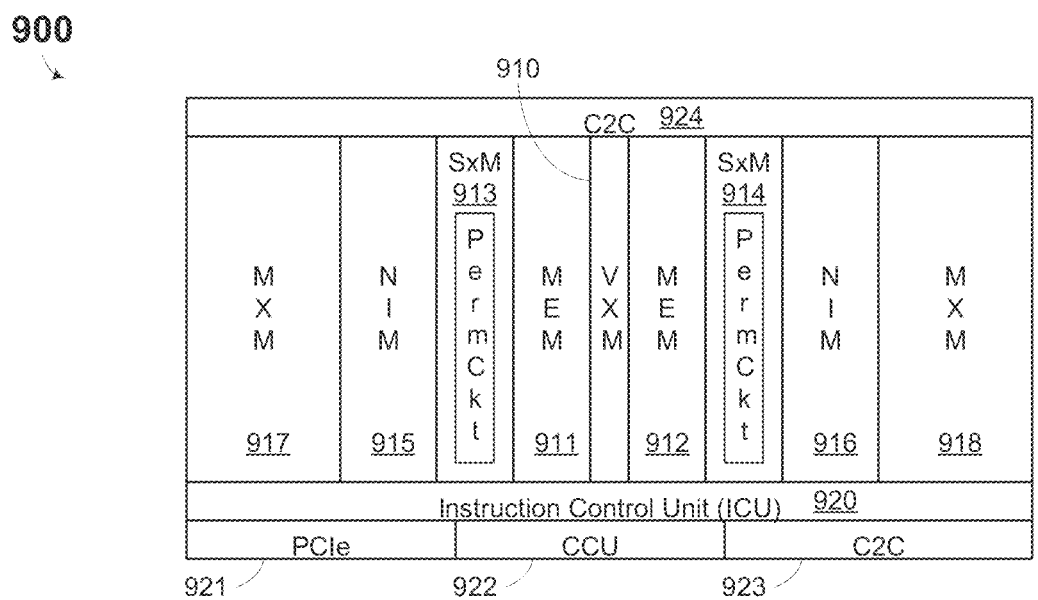
FIG. 9 illustrates an example machine learning processor according to one embodiment.

FIG. 9 illustrates an example machine learning processor according to one embodiment. Machine learning processor 900 (aka, Artificial Intelligence (AI) processor) may include memory and arithmetic units optimized for multiplying and adding input data with weight sets (e.g., trained or being trained) for machine learning applications (e.g., training or inference). For example, machine learning processor 900 includes a vector processor (V×M) 910 for performing operations on vectors (i.e., one-dimensional arrays of values). Other elements of the system are arranged symmetrically on either side of the V×M 910 to optimize processing speed. For example, V×M 910 is adjacent to memories 911 and 912, switch matrices (S×M) 913 and 914 including permutation circuits as described above to control routing and permutation of data. Processor 900 further includes data format and presentation controllers (NIM) 915 and 916, and matrix multiplication units (M×M) 917 and 918. An instruction control unit (ICU) 920 controls the flow of data and execution of operations across blocks 910-918, for example. Machine learning processor 900 includes communications circuits such as chip-to-chip (C2C) circuits 923-924 and an external communication circuit (PCIe) 921. Processor 900 may further include a chip control unit (CCU) 922 to control boot operations, clock resets, and other low level setup operations, for example.

Figure 10:
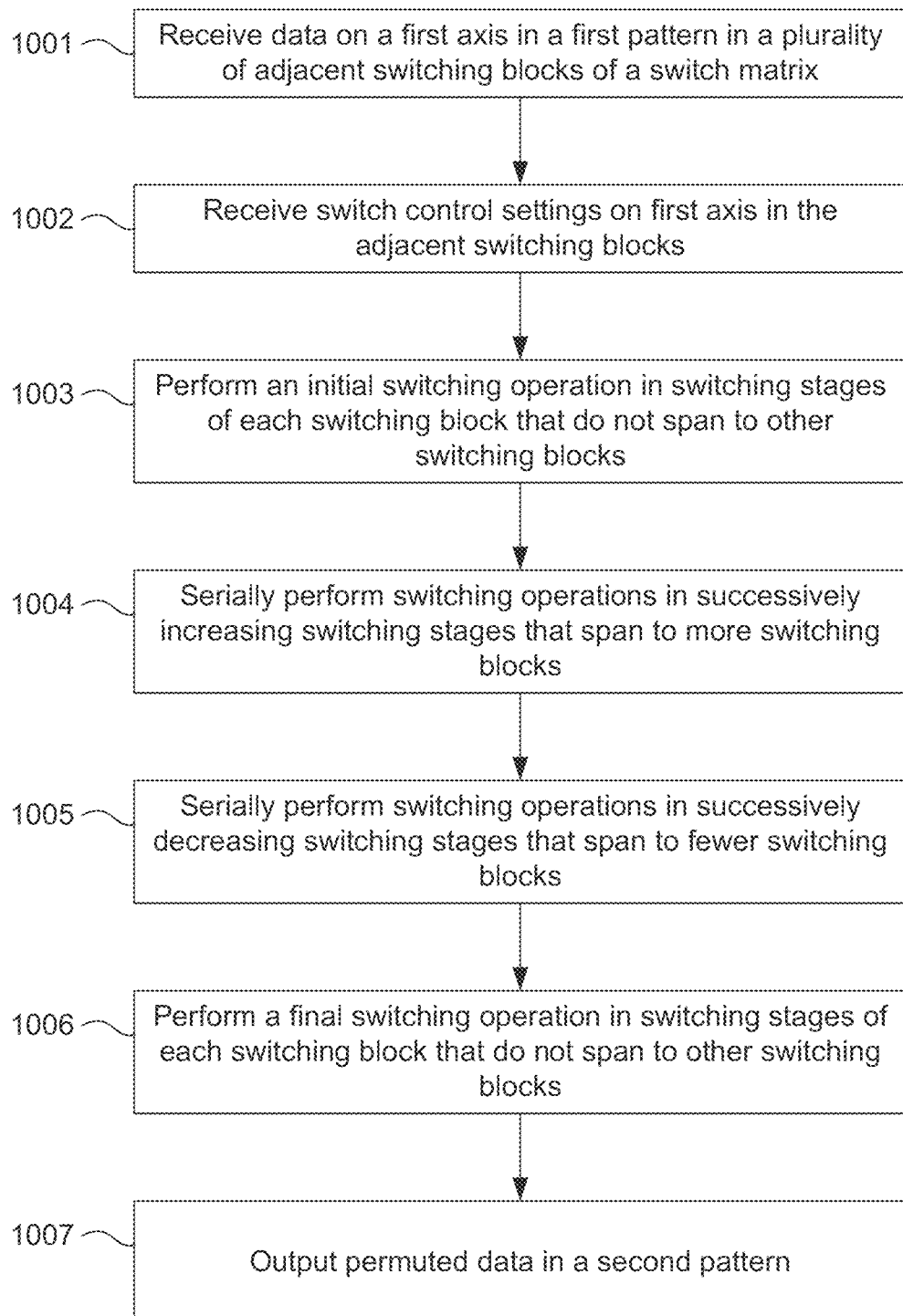
FIG. 10 illustrates a method of switching data according to an embodiment.

FIG. 10 illustrates a method of switching data according to an embodiment. This example illustrates a method that may be performed by an integrated circuit, for example, for carrying out a data permutation. At 1001, data is received on a first axis in a first pattern in a plurality of adjacent switching blocks (e.g., rectangular tiles) of a switch matrix. The switching blocks may be integrated circuit blocks laid out adjacent to one another along one axis of a semiconductor die, for example. The blocks may be substantially copies of one block that are stacked next to each other along a one axis of the die, for example. At 1002, switch control settings are received on the first axis in the adjacent switching blocks. The data and switch control settings may be received along an axis of the die that is orthogonal (perpendicular) to the axis on which the blocks are laid out, for example. At 1003, an initial switching operation is performed in switching stages of each switching block that do not span to other switching blocks. The initial switching operation may route input data through an N×N switching stage, such as 16×16, that is pre-configured used the switch control settings, for example. At 1004, additional switching operations are performed serially in successively increasing switching stages that progressively span to more switching blocks. At 1005, further switching operations are performed serially in successively decreasing switching stages that progressively span to fewer switching blocks. In one example embodiment, switching stages that span multiple blocks may couple data between the switching blocks along the axis that is orthogonal to the axis the data is received on, for example. As illustrated above, the method may include, for switching stages that span multiple switching blocks, coupling data from outputs of one of the successively increasing and/or decreasing switching stages onto and/or off of a bus running between the switching blocks along the axis that the blocks are arranged side-by-side, for example. At 1006, a final switching operation is performed in switching stages of each switching block that do not span to other switching blocks, for example. At 1007, permuted data is output having a second pattern different from the first pattern received on the input.

The above steps 1003-1006 may perform a data permutation, where the particular permutation is based on the switching control settings received at step 1002. In one embodiment, the method includes mapping specified permutations in software to the switching control settings and associating the switch control settings with operations and particular data sets, for example. The method may include storing predefined switch control settings in memory, and sending the stored switch control settings to a permutation circuit comprising the switching stages mentioned above to configure the switching stages to perform different permutations on different data sets, for example. In one embodiment, one set of switch control settings may be sent to configure the switching stages and the corresponding permutation may be performed on multiple data sets without changing the switch control settings (e.g., performing numerous transposes on multiple sets of matrix data). Conversely, the same data set may be permuted in multiple different ways by changing the switch control settings and reloading the same data into the permutation circuit, for example.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A permutation circuit comprising:
a plurality of switching groups each comprising a plurality of switching stages;
for each switching group, a first subset of the plurality of switching stages receiving input data and switch control settings, switching stages in the first subset span to successively more adjacent switching blocks, each switching block comprises a defined number of input and output data lines;
for each switching group, a second subset of the plurality of switching stages generating an output data with an output pattern different from an input pattern of the input data based on the switch control settings, switching stages in the second subset span to successively fewer adjacent switching blocks; and
an intermediate switching stage selectively coupling an output switching stage of the first subset with an input switching stage of the second subset, wherein the output switching stage belongs to a first of the switching groups, the input switching stage belongs to a second of the switching groups, the intermediate switching stage spanning the plurality of switching groups and comprising a first number of M×M switches in each switching block, wherein the first number is a number of switching blocks in each switching group, and M is a number of the switching groups.

2. The permutation circuit of claim 1, wherein one or more of the plurality of switching stages is one of: a 16 by 16 switch, a 32 by 32 switch, and a 64 by 64 switch.

3. The permutation circuit of claim 1, wherein one or more of the plurality of switching stages is one of: a N by N switch, a 2N by 2N switch, and a 4N by 4N switch, N being an integer.

4. The permutation circuit of claim 1, wherein a first plurality of the switch control settings configure the permutation circuit to perform first data permutations on the input data, and a second plurality of the switch control settings configure the permutation circuit to perform second data permutations on the input data different from the first data permutations.

5. The permutation circuit of claim 4, wherein the first and second data permutations are mapped to the switch control settings and stored in a memory coupled to the permutation circuit.

6. The permutation circuit of claim 1, wherein a first switching stage of the first subset directly receives the input data having the input pattern, and a second switching stage of the second subset directly produces the output data having the output pattern.

7. The permutation circuit of claim 6, wherein outputs of the first switching stage are shuffled between the first switching stage and a second switching stage of the first subset.

8. The permutation circuit of claim 6, wherein outputs of a switching stage of the second subset are unshuffled between a first switching stage of the second subset and the second switching stage.

9. The permutation circuit of claim 1, wherein the intermediate switching stage has inputs coupled to outputs of the output switching stage of the first subset and has outputs coupled to inputs of the input switching stage of the second subset, the output switching stage being the largest among switching stages of the first subset, and the input switching stage being the largest among switching stages of the second subset.

10. The permutation circuit of claim 1, wherein the permutation circuit is distributed across a plurality of switching blocks.

11. The permutation circuit of claim 10, wherein two or more of the plurality of switching stages span a plurality of adjacent switching blocks of the plurality of switching blocks and at least one of the plurality of switching stages does not span the adjacent switching blocks.

12. The permutation circuit of claim 1, wherein different data permutations are mapped to different versions of the switch control settings and are specified for different sets of the input data.

13. The permutation circuit of claim 1, wherein the permutation circuit is part of an artificial intelligence processor.

14. A method comprising:
for each switching group of a plurality of switching groups each comprising a plurality of switching stages, receiving, by a first subset of the plurality of switching stages, input data and switch control settings, switching stages in the first subset span to successively more adjacent switching blocks, each switching block comprises a defined number of input and output data lines;
selectively coupling, via an intermediate switching stage, an output switching stage of the first subset with an input switching stage of a second subset of the plurality of switching stages, switching stages in the second subset span to successively fewer adjacent switching blocks, wherein the output switching stage belongs to a first of the switching groups, the input switching stage belongs to a second of the switching groups, the intermediate switching stage spanning the plurality of switching groups and comprising a first number of M×M switches in each switching block, wherein the first number is a number of switching blocks in each switching group, and M is a number of the switching groups; and for each switching group, generating, by the second subset of the plurality of switching stages, an output data with an output pattern different from an input pattern of the input data based on the switch control settings.

15. The method of claim 14, further comprising:

coupling inputs of the intermediate switching stage to outputs of the output switching stage of the first subset; and coupling outputs of the intermediate switching stage to inputs of the input switching stage of the second subset, wherein the output switching stage is the largest among switching stages of the first subset, and the input switching stage is the largest among switching stages of the second subset.

16. The method of claim 14, further comprising:

shuffling the input data of a first pattern between a pair of switching stages of the first subset; and unshuffling the input data of a second pattern between a pair of switching stages of the second subset.

17. The method of claim 14, further comprising distributing the plurality of switching stages across a plurality of switching blocks, two or more of the plurality of switching stages span a plurality of adjacent switching blocks of the plurality of switching blocks and at least one of the plurality of switching stages does not span the adjacent switching blocks.

18. The method of claim 14, wherein one or more of the plurality of switching stages is one of: a N by N switch, a 2N by 2N switch, and a 4N by 4N switch, N being an integer.

* * * * *